(12) United States Patent
Kim

(10) Patent No.: US 8,399,919 B2
(45) Date of Patent: Mar. 19, 2013

(54) UNIT BLOCK CIRCUIT OF SEMICONDUCTOR DEVICE

(75) Inventor: Jong-Woo Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 254 days.

(21) Appl. No.: 12/832,397

(22) Filed: Jul. 8, 2010

(65) Prior Publication Data

US 2011/0101433 A1 May 5, 2011

(30) Foreign Application Priority Data

Oct. 30, 2009 (KR) .................. 10-2009-0104595

(51) Int. Cl.
*H01L 29/792* (2006.01)
*H01L 29/788* (2006.01)

(52) U.S. Cl. ........ 257/326; 257/202; 257/296; 257/368; 257/E21.54; 257/E27.062; 257/E27.84; 365/185.01; 365/185.26; 365/185.28; 438/585; 438/587

(58) Field of Classification Search .................. 257/202, 257/296, 326, 368, E21.54, E27.062, E27.084; 365/188.01, 185.26, 185.28; 438/585, 587
See application file for complete search history.

(56) References Cited

U.S. PATENT DOCUMENTS

| 7,940,561 | B2 * | 5/2011 | Shiba et al. | 365/185.01 |
| 8,189,377 | B2 * | 5/2012 | Shiba et al. | 365/185.01 |
| 2006/0050566 | A1 * | 3/2006 | Shiba et al. | 365/185.28 |
| 2006/0170035 | A1 * | 8/2006 | Shiba et al. | 257/326 |

* cited by examiner

*Primary Examiner* — Dao H Nguyen
(74) *Attorney, Agent, or Firm* — IP & T Group LLP

(57) ABSTRACT

A unit block circuit of a semiconductor device includes a first well, a first pickup unit configured to form a closed loop over the first well, a first transistor including a first gate and a first active region, and formed within the first pickup unit, and a first reservoir capacitor formed in a spare within the first pickup unit and arranged in a major-axis direction of the first gate of the first transistor, wherein the first reservoir capacitor comprises a second active region and a second gate, the second gate being formed over the second active region.

15 Claims, 4 Drawing Sheets

UNIT BLOCK CIRCUIT OF SEMICONDUCTOR DEVICE

CROSS-REFERENCE TO RELATED APPLICATIONS

The present application claims priority of Korean Patent Application No. 10-2009-0104595, filed on Oct. 30, 2009, which is incorporated herein by reference in its entirety.

BACKGROUND OF THE INVENTION

Exemplary embodiments of the present invention relate to a semiconductor device, and more particularly, to a unit block circuit of a semiconductor device including a reservoir capacitor which is improved to obtain efficient space utilization within the unit block circuit formed in a peripheral region.

In a semiconductor device, such as a dynamic random access memory (DRAM), a circuit region may be divided into a core region in which cells storing data are arranged, and a peripheral region in which circuits related to data input/output are arranged.

The peripheral region may include unit block circuits which manage functions necessary for data input/output. The unit block circuit is a unit cell in which transistors implementing at least one logic operation are formed, and is also called a leaf cell.

FIG. 1 is a layout diagram illustrating a structure of a typical MOS transistor.

As shown in FIG. 1, a MOS transistor configured in the unit block circuit includes a gate 10, an active region 12, and contacts 14.

The gate 10 is patterned on the active region 12, and portions of the active region 12 on opposite sides of the gate 10 correspond to a source and a drain. The source and the drain formed at opposite sides of the active region 12 are electrically connected to a top conductive layer by the contacts 14. In this manner, transistors each having the gate, the source, and the drain are fabricated.

FIG. 2 is a layout diagram illustrating a typical unit block circuit comprising a plurality of MOS transistors.

The above-described transistors of FIG. 1 constitute a unit block circuit of FIG. 2. Referring to FIG. 2, an N well is formed on a P well, and a pickup unit 20 defining a rectangular closed loop is formed in the N well. Transistors in which one or more gates are formed on the active region 24 are formed within the pickup unit 20. Contacts 26 are formed in the active region 24 including the source and the drain regions.

Meanwhile, if necessary, the peripheral region may include a reservoir capacitor so as to ensure a capacitance for potential stabilization.

The reservoir capacitor is designed in the peripheral region in order to ensure a sufficient capacitor region within semiconductor devices which are becoming more highly integrated. In general, the reservoir capacitor has a decoupling function.

However, as the semiconductor memory device becomes more highly integrated, a chip size tends to be reduced and a spare space where the reservoir capacitor can be formed in the peripheral region tends to be reduced, as well.

Therefore, it is necessary to ensure a sufficient capacitance in order to supply a more stable voltage to a semiconductor memory device. To this end, there is a need to ensure a space where reservoir capacitors can be formed in the semiconductor memory device.

In the above-described unit block circuit of FIG. 2, a spare space 28 remaining after the formation of the transistors exists in the rectangular pickup unit 20. It is necessary to seek ways of using the spare space 28 to ensure a capacitance.

Therefore, there is a need to suggest a method for forming a reservoir capacitor in a spare space defined within a unit block circuit of FIG. 2.

SUMMARY OF THE INVENTION

Exemplary embodiments of the present invention are directed to a unit block circuit which is capable of obtaining efficient space utilization by forming a reservoir capacitor having high space utilization efficiency within the unit block circuit designed in a peripheral region.

In accordance with an exemplary embodiment of the present invention, a unit block circuit of a semiconductor device includes: a first well, a first pickup unit constituting a rectangular closed loop over the first well, a first transistor including a first gate and a first active region, and formed within the closed loop of the first pickup unit, and a first reservoir capacitor formed in a spare within the first pickup unit and arranged in a major axis direction of the first gate of the first transistor, wherein the first reservoir capacitor includes a second active region and a second gate, the second gate being formed over the second active region and extending in a direction substantially equal to the major-axis direction of the first gate of the first transistor, portions of the second active region on opposite sides of the second gate are electrically shorted together, the second active region has a width substantially equal to a width of the first active region of the first transistor, and the second gate has a width substantially equal to a width of a region covering the first gate and any other gates of the first transistor and the area between them.

The unit block circuit may further include one or more additional transistors and one or more additional reservoir capacitors, corresponding to the additional transistors, wherein the additional reservoir capacitors have active regions of different lengths than the length of the second active region of the first reservoir capacitor.

The unit block circuit may include an additional transistor, wherein the second active region of the first reservoir capacitor may have a width substantially equal to a width of a region covering the first active region of the first transistor, an active region of the additional transistor, and the area between them, and the second gate of the first reservoir capacitor may have a width substantially equal to a width of a gate region covering the first gate, any gates of the additional transistor, and the area between them.

The unit block circuit may further include a second well formed by impurities whose type is different from a type of the first well, a second pickup unit formed over the second well, and a second transistor and a second reservoir capacitor formed within the second pickup unit, wherein a layout of the second transistor and the second reservoir capacitor within the second pickup unit mirrors a layout of the first transistor and the first reservoir capacitor within the first pickup unit.

The unit block circuit may further include a third well formed by impurities whose type is different from a type of the first well, a third pickup unit formed over the third well, a third transistor formed within the third pickup unit, and a third reservoir capacitor including a third active region and a third gate, the third gate being formed over the third active region and extending in the major-axis direction of the first gate of the first transistor, wherein a layout of the third transistor and the third reservoir capacitor within the third pickup unit mirrors a layout of the first transistor and the first reservoir capacitor within the first pickup unit, portions of the third active region on opposite sides of the third gate are electrically shorted together, the third active region has a width substantially equal to a width of the second active region of the first reservoir capacitor, and the third gate has a width substantially equal to a width of the second gate of the first reservoir capacitor.

In accordance with another exemplary embodiment of the present invention, a unit block circuit of a semiconductor device includes a first well, a first pickup unit configured to form a closed loop over the first well, the first pickup unit classified with first and second areas, one or more first transistors formed within the first area of the first pickup unit, the first transistors each comprising a first active region and a first gate being formed over the first active region, and a first reservoir capacitor corresponding to one of the first transistors and formed within the second area of the first pickup unit and arranged in a major-axis direction of the corresponding first gate of the corresponding first transistor, wherein the first reservoir capacitor comprises a second active region and a second gate, the second gate being formed over the second active region.

Portions of the second active region on opposite sides of the second gate may be electrically shorted together.

The second active region may have a width substantially equal to a width of the corresponding first active region of the corresponding first transistor, and the second gate may have a width substantially equal to a width of the corresponding first gate of the corresponding first transistor.

The first reservoir capacitor may correspond to two or more of the first transistors, and the second active region may have a width substantially equal to a width of the two or more first active regions of the two or more first transistors, and the second gate may have a width substantially equal to a width of a region covering the two or more first gates of the two or more first transistors and the area between the two or more first gates.

The first reservoir capacitor may correspond to two or more of the first transistors, and the second active region of the first reservoir capacitor may have a width equal to a sum of the widths of the two or more first active regions of the two or more first transistors, and a distance between the two or more first active regions of the two or more first transistors.

The unit block circuit may further include a second well formed by impurities whose type is different from a type of the first well, a second pickup unit formed over the second well, the second pickup unit classified with third and fourth areas, and a second transistor and a second reservoir capacitor formed within the third and fourth areas of the second pickup unit, respectively, wherein a layout of the third and fourth areas of the second pickup unit mirrors a layout of the first and second areas of the first pickup unit.

The unit block circuit may further include a third well formed by impurities whose type is different from a type of the first well, a third pickup unit formed over the third well, the third pickup unit classified with fifth and sixth areas, a third transistor formed within the fifth area of the third pickup unit, and a third reservoir capacitor including a third active region and a third gate formed within the sixth area of the third pickup unit, the third gate being formed over the third active region and extending in the major-axis direction of the corresponding first gate of the corresponding first transistor, wherein a layout of the fifth and sixth areas of the third pickup unit mirrors a layout of the first and second areas of the first pickup unit.

Portions of the third active region on opposite sides of the third gate may be electrically shorted together.

The third active region may have a width substantially equal to a width of the second active region of the first reservoir capacitor, and the third gate may have a width substantially equal to a width of the second gate of the first reservoir capacitor.

DESCRIPTION OF SPECIFIC EMBODIMENTS

Figure 1:
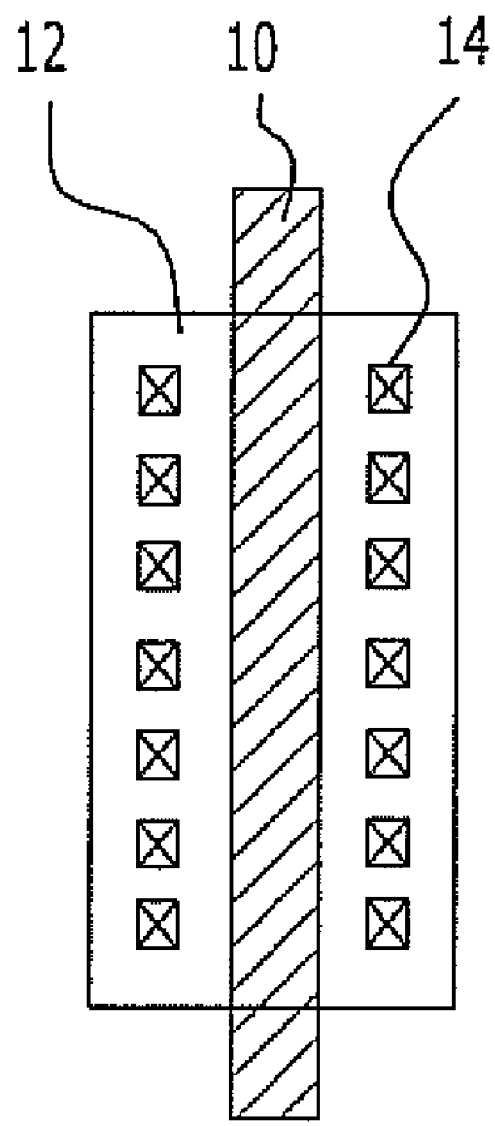
FIG. 1 is a layout diagram illustrating a structure of a typical MOS transistor.
Figure 2:
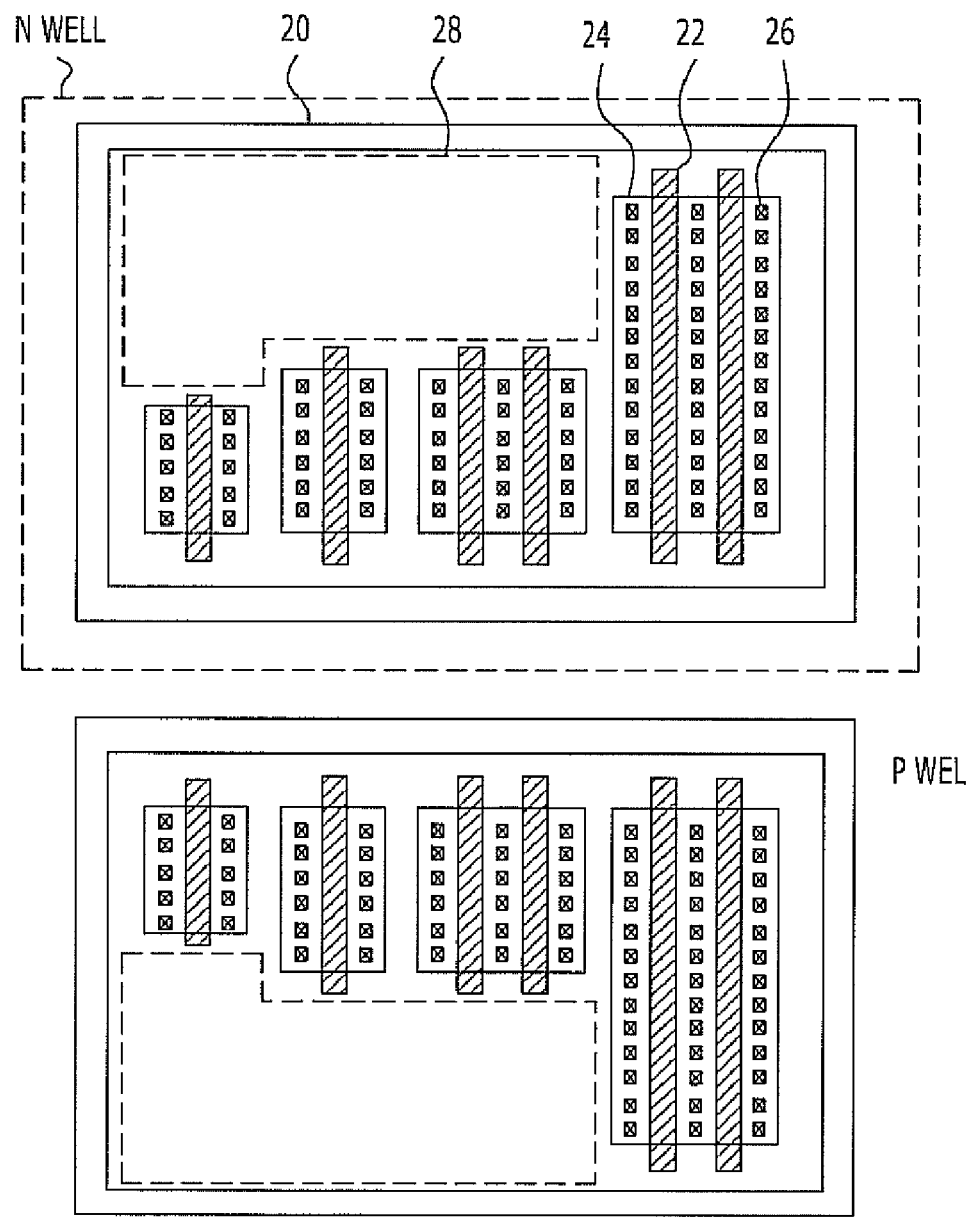
FIG. 2 is a layout diagram illustrating a typical unit block circuit comprising a plurality of MOS transistors.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Exemplary embodiments of the present invention are directed to providing a technology which forms a reservoir capacitor in a spare space within a pickup unit in a unit block circuit of a semiconductor device.

Figure 3:
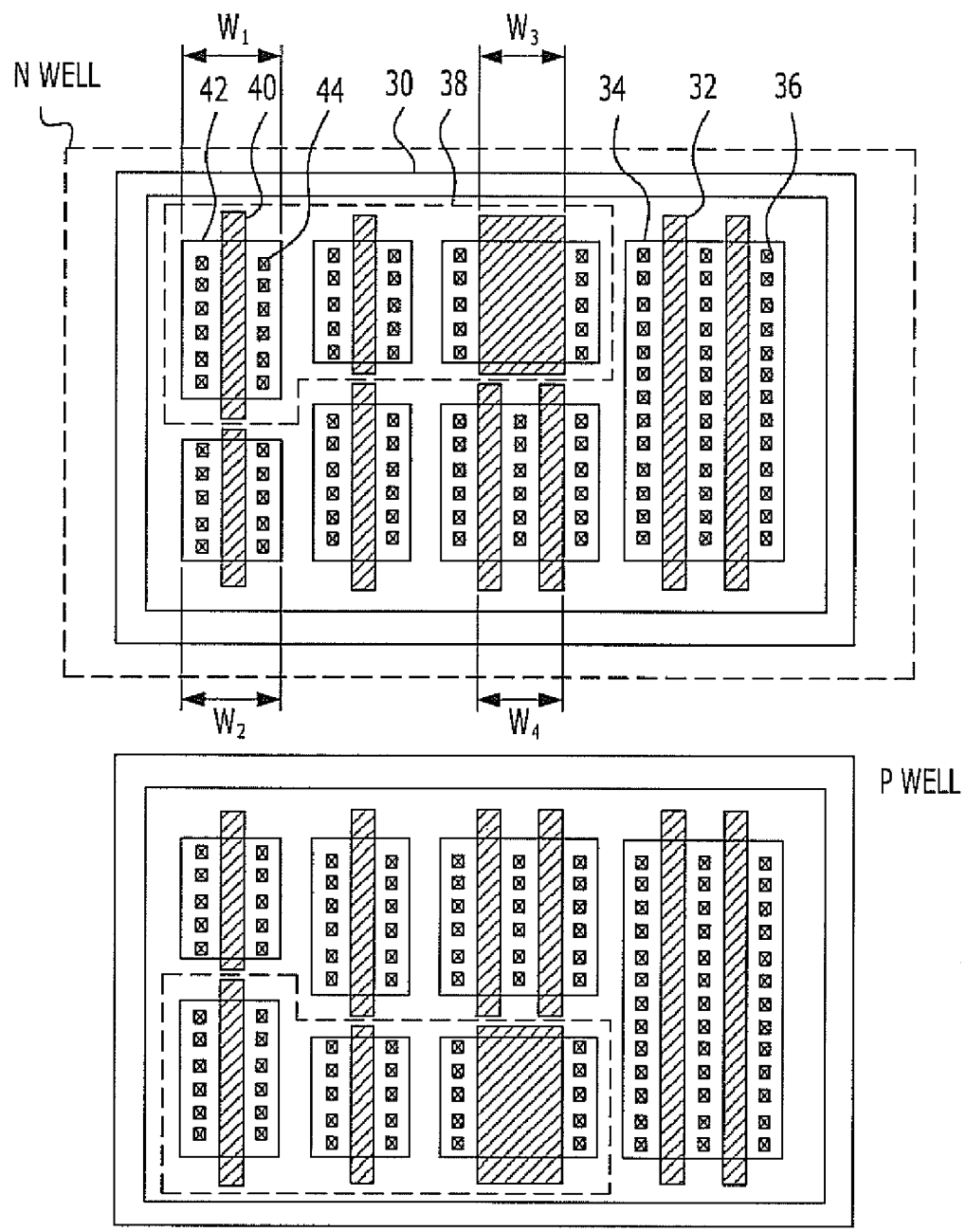
FIG. 3 is a layout diagram illustrating a method for fabricating a unit block circuit in accordance with an exemplary embodiment of the present invention.

FIG. 3 illustrates a unit block circuit of a semiconductor device in accordance with an exemplary embodiment of the present invention. Referring to FIG. 3, an N well is formed on a P well. The P well and the N well are formed by implanting P-type and N-type impurity ions, respectively.

A pickup unit 30 is formed on the N well and it corresponds to a typical guard ring. A plurality of transistors is formed within the pickup unit 30. Each of the transistors includes a gate 32, an active region 34, and contacts 36.

The respective transistors may be formed on active regions 34 having the same size and area, but FIG. 3 illustrates an exemplary layout in which the respective transistors are formed on active regions 34 having different sizes and areas.

In the active regions 34 having different sizes, the gates 32 are formed to have lengths corresponding to the size of the respective active regions 34.

The gates 32 overlap the active regions 34, and the contacts 36 are formed in the active regions 34 on both sides of the gates 32. The active regions 34 on opposite sides of the gate 32 correspond to source/drain regions, and the contacts 36 are formed to provide electrical connections to the active regions 34.

As shown in FIG. 3, the transistors may be arranged side by side, so that they extend in directions that are approximately parallel to each other. When the transistors have different sizes and areas, a spare space 38 may be formed adjacent to the smaller transistors, and a reservoir capacitor may be formed in the spare space 38.

The reservoir capacitor includes a gate 40, an active region 42, and contacts 44. The gate 40 and the active region 42 constituting the reservoir capacitor may be formed with dummy patterns. In the reservoir capacitor, portions of the active region 42 on both sides of the gate 40 are electrically shorted together (i.e., electrically connected together). In this manner, the reservoir capacitor has an electrode structure in which the gate 40 serves as a first electrode and the active region 42 serves as a second electrode. An operating voltage may be applied to the gate 40 of the reservoir capacitor, and a ground voltage may be applied to the electrically shorted active region 42.

The above-described reservoir capacitor may be formed in a manner similar to the transistors. Moreover, a reservoir capacitor may be formed to correspond with a particular transistor. The active region 42 of the reservoir capacitor may have the same width as that of the active region 34 of the corresponding transistor, and the gate 40 of the reservoir capacitor may have the same width as that of the gate 32 of the corresponding transistor.

Moreover, the size of a reservoir capacitor may depend on the size of a corresponding transistor. When the size of a transistor is small, the corresponding reservoir capacitor may be bigger. Whereas, when the size of a transistor is large, the corresponding reservoir capacitor may have a smaller size. Furthermore, the formation of the reservoir capacitor may be omitted when the transistor is formed to be a particular size, such that there is not enough spare space to form the reservoir capacitor.

Moreover, when a transistor has two or more gates 32, that is, the transistor includes gates having a finger structure, the gate 40 of the corresponding reservoir capacitor may be formed to have a width approximately equal to the width of a region covering the gates 32 and the area in between them.

Referring to FIG. 3, for example, the width W1 of the active region 42 of a reservoir capacitor may be approximately equal to the width W2 of the active region 34 of a corresponding transistor. Furthermore, the width W3 of the gate 40 of a reservoir capacitor may be approximately equal to the width W4 of a gate region covering the gates 32 of a corresponding transistor and the area between them.

As described above, the reservoir capacitor may be formed in the spare space 38. Also, as described above, the pickup unit 30, the transistor, and the reservoir capacitor may be formed in the N well. Furthermore, a pickup unit, a transistor, and a reservoir capacitor, formed as described above, may also be formed in a P well, such that the layout/arrangement of the pickup unit, transistor, and reservoir capacitor formed in the P well mirrors the layout/arrangement of the same elements formed in the N well.

Figure 4:
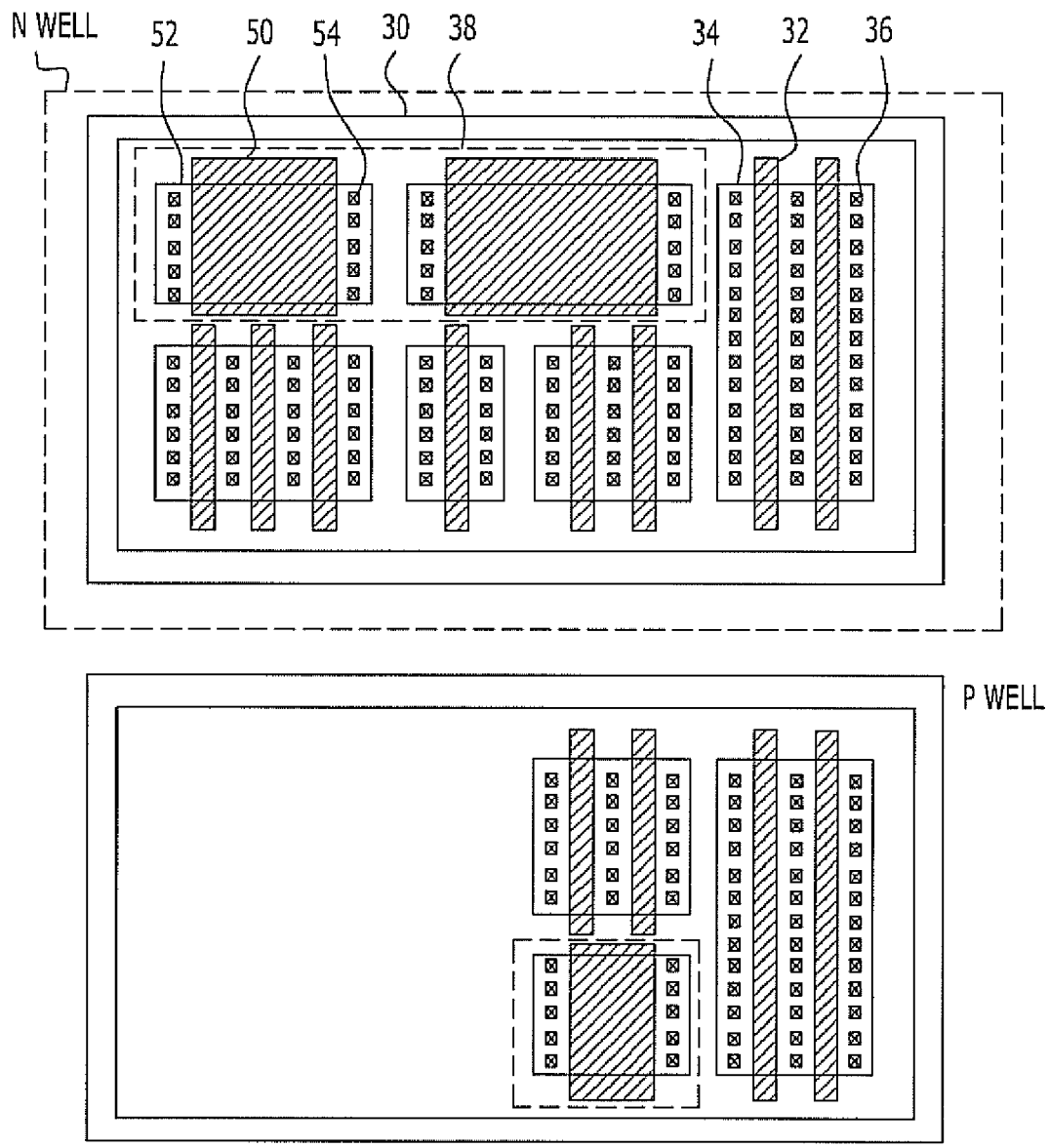
FIG. 4 is a layout diagram illustrating a method for fabricating a unit block circuit in another exemplary embodiment of the present invention.

FIG. 4 illustrates a unit block circuit of a semiconductor device in accordance with another exemplary embodiment of the present invention. As illustrated in FIG. 4, an N well and a P well may not have layouts/arrangements that mirror each other.

Referring to FIG. 4, an active region 52 of a reservoir capacitor having a width corresponding to the active regions 34 of two or more transistors may be formed within a pickup unit 30 on an N well. In this case, a gate 50 of the reservoir capacitor may be formed to have a width approximately equal to the width of a region covering the gates 32 of the corresponding transistors and the area in between them. Contacts 54 are formed in the active regions 52 on both sides of the gate 50 of the above-described reservoir capacitor, and the contacts 54 are electrically shorted together to form an electrode.

In addition, transistors and reservoir capacitors, similar to those formed within the pickup unit 30 on the N well, may be formed within a pickup unit formed on a P well. Further, a reservoir capacitor may be formed in a spare space depending on the size of a corresponding transistor.

In accordance with exemplary embodiments of the present invention, the unit block circuit of the semiconductor memory device may be formed as described above with reference to FIGS. 3 and 4. The unit block circuit may include the reservoir capacitor, which may provide a capacitance for voltage stabilization, in the spare space within the pickup unit.

Since the above-described reservoir capacitor can be provided by the unit block circuit, a capacitance that is sufficient to stabilize the voltage can be ensured by the unit block circuit.

In accordance with exemplary embodiments of the present invention, the reservoir capacitor can be formed within the unit block circuit designed in the peripheral region of the semiconductor device, and the capacitance required for a stable voltage supply can be ensured, thereby maximizing the space efficiency of the unit block circuit.

While the present invention has been described with respect to the specific embodiments, it will be apparent to those skilled in the art that various changes and modifications may be made without departing from the spirit and scope of the invention as defined in the following claims.

What is claimed is:

1. A unit block circuit of a semiconductor device, comprising:
a first well;
a first pickup unit configured to form a closed loop over the first well;
a first transistor comprising a first gate and a first active region, and formed within the closed loop of the first pickup unit; and
a first reservoir capacitor formed in a spare within the first pickup unit and arranged in a major-axis direction of the first gate of the first transistor,
wherein the first reservoir capacitor comprises a second active region and a second gate, the second gate being formed over the second active region and extending in a direction substantially equal to the major-axis direction of the first gate,
portions of the second active region on opposite sides of the second gate are electrically shorted together,
the second active region has a width substantially equal to a width of the first active region of the first transistor, and
the second gate has a width substantially equal to a width of a region covering the first gate and any other gates of the first transistor and the area between them.

2. The unit block circuit of claim 1, wherein the closed loop of the first pickup unit forms a rectangular shape.

3. The unit block circuit of claim 1, further comprising one or more additional transistors and one or more additional reservoir capacitors, corresponding to the additional transistors, wherein the additional reservoir capacitors have active regions of different lengths than the length of the second active region of the first reservoir capacitor.

4. The unit block circuit of claim 1, further comprising an additional transistor, wherein the second active region of the first reservoir capacitor has a width substantially equal to a width of a region covering the first active region of the first transistor, an active region of the additional transistor, and the area between them, and the second gate of the first reservoir capacitor has a width substantially equal to a width of a gate region covering the first gate, any gates of the additional transistor, and the area between them.

5. The unit block circuit of claim 1, further comprising:
a second well formed by impurities whose type is different from a type of the first well;
a second pickup unit formed over the second well; and
a second transistor and a second reservoir capacitor formed within the second pickup unit,
wherein a layout of the second transistor and the second reservoir capacitor within the second pickup unit mirrors a layout of the first transistor and the first reservoir capacitor within the first pickup unit.

6. The unit block circuit of claim 1, further comprising:
a third well formed by impurities whose type is different from a type of the first well;
a third pickup unit formed over the third well;
a third transistor formed within the third pickup unit; and
a third reservoir capacitor comprising a third active region and a third gate, the third gate being formed over the third active region and extending in the major-axis direction of the first gate of the first transistor,
wherein a layout of the third transistor and the third reservoir capacitor within the third pickup unit mirrors a layout of the first transistor and the first reservoir capacitor within the first pickup unit,
portions of the third active region on opposite sides of the third gate are electrically shorted together,
the third active region has a width substantially equal to a width of the second active region of the first reservoir capacitor, and
the third gate has a width substantially equal to a width of the second gate of the first reservoir capacitor.

7. A unit block circuit of a semiconductor device, comprising:
a first well;
a first pickup unit configured to form a closed loop over the first well, the first pickup unit classified with first and second areas;
one or more first transistors formed within the first area of the first pickup unit, the first transistors each comprising a first active region and a first gate being formed over the first active region; and
a first reservoir capacitor corresponding to one of the first transistors and formed within the second area of the first pickup unit and arranged in a major-axis direction of the corresponding first gate of the corresponding first transistor,
wherein the first reservoir capacitor comprises a second active region and a second gate, the second gate being formed over the second active region,
wherein the second gate has a width substantially equal to a width of the corresponding first gate of the corresponding first transistor.

8. The unit block circuit of claim 7, wherein portions of the second active region on opposite sides of the second gate are electrically shorted together.

9. The unit block circuit of claim 7, wherein the second active region has a width substantially equal to a width of the corresponding first active region of the corresponding first transistor.

10. The unit block circuit of claim 7, further comprising:
a second well formed by impurities whose type is different from a type of the first well;
a second pickup unit formed over the second well, the second pickup unit classified with third and fourth areas; and
a second transistor and a second reservoir capacitor formed within the third and fourth areas of the second pickup unit, respectively,
wherein a layout of the third and fourth areas of the second pickup unit mirrors a layout of the first and second areas of the first pickup unit.

11. The unit block circuit of claim 7, further comprising:
a third well formed by impurities whose type is different from a type of the first well;
a third pickup unit formed over the third well, the third pickup unit classified with fifth and sixth areas;
a third transistor formed within the fifth area of the third pickup unit; and
a third reservoir capacitor comprising a third active region and a third gate formed within the sixth area of the third pickup unit, the third gate being formed over the third active region and extending in the major-axis direction of the corresponding first gate of the corresponding first transistor,
wherein a layout of the fifth and sixth areas of the third pickup unit mirrors a layout of the first and second areas of the first pickup unit.

12. The unit block circuit of claim 11, wherein portions of the third active region on opposite sides of the third gate are electrically shorted together.

13. The unit block circuit of claim 11, wherein the third active region has a width substantially equal to a width of the second active region of the first reservoir capacitor, and the third gate has a width substantially equal to a width of the second gate of the first reservoir capacitor.

14. A unit block circuit of a semiconductor device, comprising:
a well;
a pickup unit configured to form a closed loop over the well, the pickup unit classified with first and second areas;
two or more transistors formed within the first area of the pickup unit, the transistors each comprising a first active region and a first gate formed over the first active region; and
a reservoir capacitor corresponding to the transistors and formed within the second area of the pickup unit and arranged in a major-axis direction of the first gates of the two or more transistors, wherein the reservoir capacitor comprises a second active region and a second gate formed over the second active region,
wherein the second active region has a width substantially equal to a width of the two or more first active regions of the two or more transistors, and the second gate has a width substantially equal to a width of a region covering the two or more first gates of the two or more transistors and the area between the two or more first gates.

15. A unit block circuit of a semiconductor device, comprising:
a well;
a pickup unit configured to form a closed loop over the well, the pickup unit classified with first and second areas;
two or more transistors formed within the first area of the pickup unit, the transistors each comprising a first active region and a first gate formed over the first active region; and
a reservoir capacitor corresponding to the transistors and formed within the second area of the pickup unit and arranged in a major-axis direction of the first gates of the two or more transistors, wherein the reservoir capacitor comprises a second active region and a second gate formed over the second active region,
wherein the second active region has a width equal to a sum of the widths of the two or more first active regions of the two or more transistors, and a distance between the two or more first active regions of the two or more transistors.

* * * * *